United States Patent
Yeh et al.

(10) Patent No.: US 9,224,790 B2
(45) Date of Patent: Dec. 29, 2015

(54) ILLUMINATION DEVICE

(71) Applicant: INDUSTRIAL TECHNOLOGY RESEARCH INSTITUTE, Hsinchu (TW)

(72) Inventors: Wen-Yung Yeh, Hukou Township (TW); Yi-Ming Chang, Hsinchu (TW); Su-Tsai Lu, Hsinchu (TW); Chen-Kun Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/447,152

(22) Filed: Jul. 30, 2014

(65) Prior Publication Data

US 2015/0129848 A1    May 14, 2015

Related U.S. Application Data

(60) Provisional application No. 61/903,801, filed on Nov. 13, 2013.

(51) Int. Cl.
| | |
|---|---|
| *H01L 27/32* | (2006.01) |
| *H01L 51/00* | (2006.01) |
| *G06F 3/041* | (2006.01) |
| *G06F 3/0488* | (2013.01) |

(52) U.S. Cl.
CPC .......... *H01L 27/323* (2013.01); *G06F 3/0412* (2013.01); *H01L 27/3297* (2013.01); *G06F 3/041* (2013.01); *G06F 3/0416* (2013.01); *G06F 3/0488* (2013.01); *H01L 51/0097* (2013.01); *H01L 2251/5338* (2013.01); *H01L 2251/5361* (2013.01)

(58) Field of Classification Search
CPC ................ H01L 2251/5338; H01L 51/0097; G06F 3/041; G06F 3/0416; G06F 3/0488
See application file for complete search history.

(56) References Cited

U.S. PATENT DOCUMENTS

| | | | |
|---|---|---|---|
| 8,552,936 B2* | 10/2013 | Hente | 345/76 |
| 2007/0018969 A1* | 1/2007 | Chen et al. | 345/173 |
| 2009/0027371 A1* | 1/2009 | Lin et al. | 345/207 |
| 2010/0182282 A1* | 7/2010 | Kurokawa et al. | 345/175 |
| 2010/0225615 A1* | 9/2010 | Kurokawa | 345/175 |
| 2010/0302192 A1* | 12/2010 | Park et al. | 345/173 |
| 2011/0267284 A1* | 11/2011 | Lee et al. | 345/173 |
| 2011/0310056 A1* | 12/2011 | Chang | 345/174 |
| 2013/0147740 A1* | 6/2013 | Wang et al. | 345/173 |
| 2013/0222282 A1* | 8/2013 | Huang et al. | 345/173 |
| 2013/0321316 A1* | 12/2013 | Wu et al. | 345/173 |
| 2014/0132568 A1* | 5/2014 | Hirose et al. | 345/175 |
| 2014/0198072 A1* | 7/2014 | Schuele et al. | 345/174 |
| 2014/0299879 A1* | 10/2014 | Yamazaki | 257/53 |
| 2014/0375910 A1* | 12/2014 | Tada et al. | 349/12 |

* cited by examiner

*Primary Examiner* — Ida M Soward
(74) *Attorney, Agent, or Firm* — Birch, Stewart, Kolasch & Birch, LLP

(57) ABSTRACT

An illumination device including a light-emitting panel, a touch panel, and a control module is provided. The light-emitting panel includes a light-emitting layer configured to emit a light beam. The touch panel is overlaid on the light-emitting panel, and includes a first touch electrode. The control module is electrically connected to the light-emitting panel and the touch panel. The light-emitting layer further includes a light-emitting material, and the width of the light-emitting material is greater than half of the width of the first touch electrode.

18 Claims, 8 Drawing Sheets

ILLUMINATION DEVICE

CROSS-REFERENCE TO RELATED APPLICATIONS

This application claims the benefit of U.S. Provisional Application No. 61/903,801, filed on Nov. 13, 2013, the contents of which are incorporated herein for reference.

TECHNICAL FIELD

The disclosure relates to an illumination device, and in particular to an illumination device with touch functionality.

BACKGROUND

The characteristics of OLED (Organic Light-Emitting Diodes) panels, such as emitting a surface light and having a film structure, make OLED panels ideal for application in the illumination field, as has been done recently. Therefore, the appearance acid design of light fixtures can be varied due to the integration of OLED panels as a light source.

However, in general the service life of OLED panels is short, and thus the purchase intention of light fixtures using OLED panels as a light source is caused, Furthermore, although existing light fixtures using OLED panels as a light source have been generally adequate for their intended purposes, they have not been entirely satisfactory in all respects. Consequently, it would be desirable to provide a solution for improving light fixtures.

SUMMARY

The present disclosure provides an illumination device having a light-emitting panel, which is a surface light source and has a film structure. Furthermore, the illumination device provides touch functionality, and the service life of the light-emitting panel is increased.

The present disclosure provides an illumination device a light-emitting panel, a touch panel, and a control module. The light-emitting panel includes a light-emitting layer configured to emit a light hear. The touch panel is overlaid on the light-emitting panel, and includes a touch electrode. The control module is electrically connected to the light-emitting panel and the touch panel.

The touch panel generates a touch signal according to a touch event, and the control module controls the light-emitting layer according to the touch signal. The light-emitting layer further includes a light-emitting material, and the width of the light-emitting material is greater than half of the width of the touch electrode.

The present disclosure provides an illumination device including a light-emitting panel, a common electrode, a touch panel, and a control module. The light-emitting panel includes a light-emitting layer configured to emit a light beam, and a control electrode disposed under the light-emitting layer. The cone it electrode is disposed on the light-emitting layer. The touch panel includes a dielectric layer overlaid on the common electrode; and a touch electrode disposed on the dielectric laver. The control module is electrically connected to the control electrode, the common electrode, and the touch electrode.

The touch electrode and the common electrode generate a touch signal according to a touch event, and the control module controls the light-emitting layer via the control electrode and the common electrode according to the touch signal. The light-emitting layer further comprises a light-emitting material, and the width of the light-emitting material is greater than half of the width of the touch electrode.

The present disclosure provides an illumination device including a first touch panel, a light-emitting panel, a second touch panel, and a control module. The first touch panel includes a first touch electrode. The light-emitting panel is overlaid on the first touch panel, and includes a light-emitting layer configured to emit a light beam. The second touch panel is overlaid on the light-emitting panel, and includes a second touch electrode. The control module is electrically connected to the light-emitting panel, the first touch panel, and the second touch panel.

The first touch panel or the second touch panel generates a touch signal according to a touch event, and the control module controls the light-emitting layer according to the touch signal. The light-emitting layer further comprises a light-emitting material, and a width of the light-emitting material is greater than half of a if the first touch electrode or a width of the second touch electrode.

In conclusion, the illumination device includes a touch panel overlaid on a light-emitting panel. The touch panel provides touch functionality to control the light-emitting panel, and the touch panel also serves as a package structure for the light-emitting panel to increase the service life of the light-emitting.

BRIEF DESCRIPTION OF THE DRAWINGS

The disclosure can be more fully understood by reading the subsequent detailed description and examples with references made to the accompanying drawings, wherein.

Figure 1:
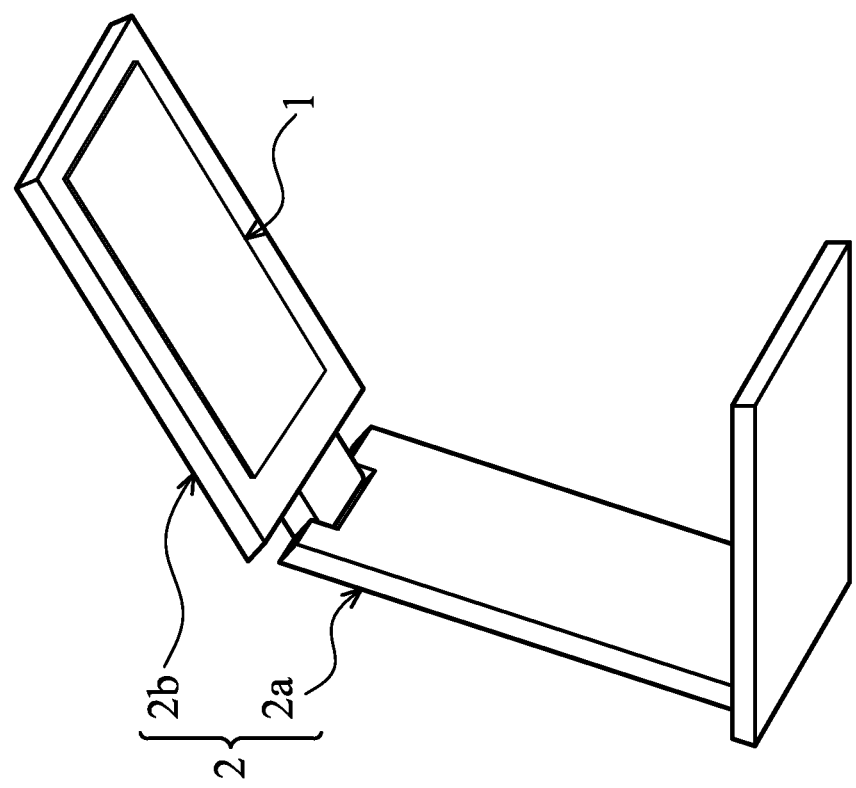
FIG. 1 is a perspective view of an illumination device in accordance with the present disclosure.

DETAILED DESCRIPTION in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a perspective view of an illumination device 100 in accordance with the present disclosure. The a ion device 100 is configured to illuminate a space, a room, an object, etc. In some embodiments, the illumination device 100 is a luminaire (a light fixture or a light fitting), such as a table lamp fixture, a standard lamp fixture, an office task light luminaire, a recessed light, a surface-mounted light, an outdoor light, a landscape light, an accent light, or a safelight.

The illumination device 100 includes an illumination module 1 and a holder 2. The illumination module 1 is configured to emit a light beam. The illumination module 1 is held by the holder 2.

In some embodiments, as shown in FIG. 1, the illumination device 100 is a table lamp fixture including a stand 2a and a holding element 2b. The stand 2a may be disposed on a table. The holding element 2b is connected to the stand 2a. The illumination module 1 is mounted at the holding element 2b. In some embodiments, the holding element 2b and the illumination module 1 are plate structures.

Figure 2:
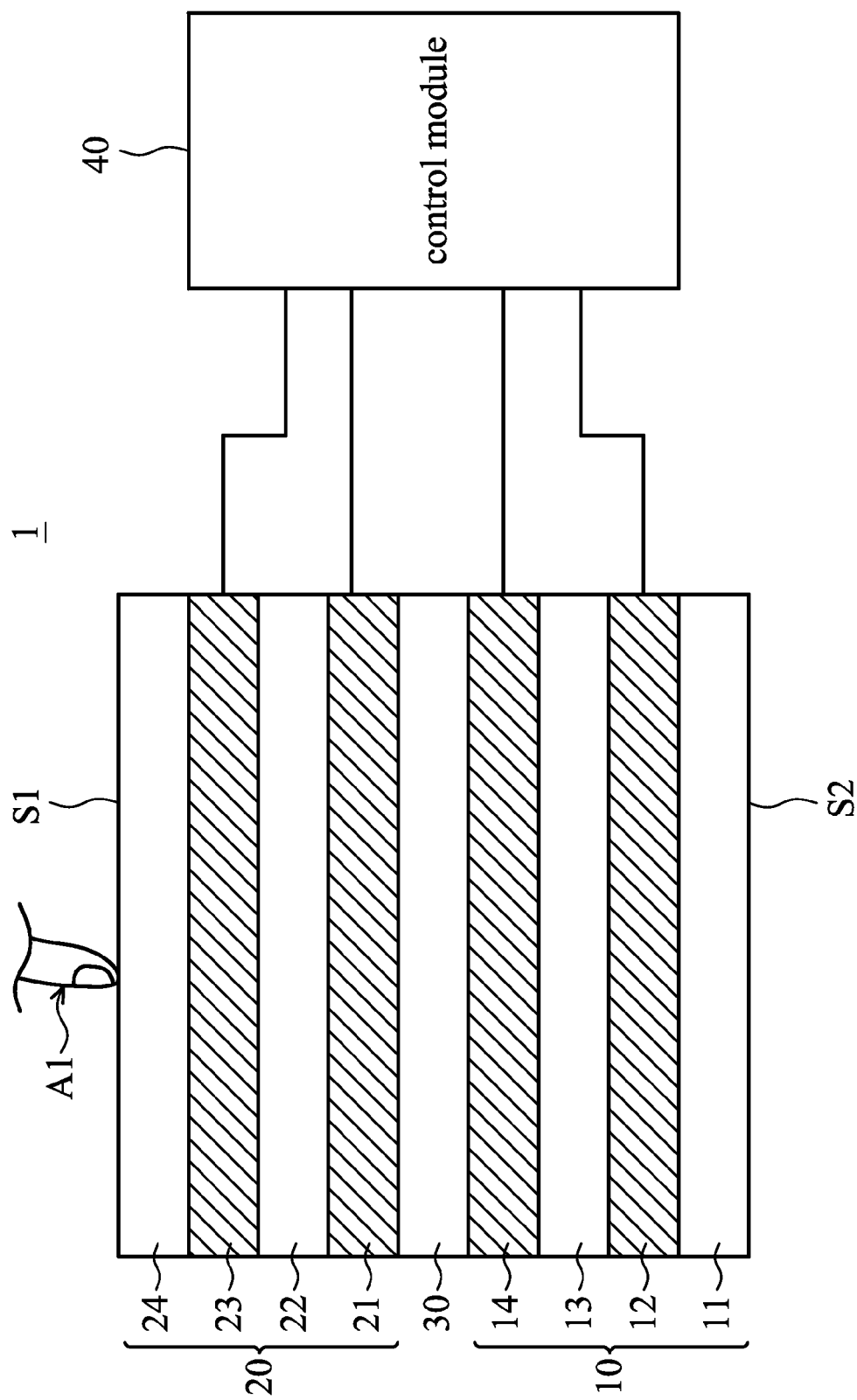
FIG. 2 is a schematic view of the illumination module in accordance with a first embodiment of the present disclosure.

FIG. 2 is a schematic view of the illumination module 1 in accordance with a first embodiment of the present disclosure. The illumination module 1 includes a light-emitting panel 10, a touch panel 20, a connection layer 30 and a control module 40. The light-emitting panel 10 and the touch panel 20 are film structures. The light-emitting panel 10 and the touch panel 20 are planar or curved.

The light-emitting panel 10 is configured to emit a light beam. The touch panel 20 is overlaid on the light-emitting panel 10, and provides touch functionality. The connection layer 30 is located between the light-emitting panel 10 and the touch panel 20, and configured combine with the light-emitting panel 10 and the touch panel 20.

The control module 40 is electrically connected to the light-emitting panel 10 and the touch panel 20. The touch panel 20 generates a touch signal according to a touch event, and the control module 40 controls the light-emitting panel 10 according to the touch signal.

In some embodiments, the light-emitting panel 10 is an OLED (Organic Light-Emitting Diode) panel. The light-emitting panel 10 includes a substrate 11, a number of control electrodes 12, a light-emitting layer 13, and a number of control electrodes 14.

The substrate 11 may be made from transparent materials, such as glass. In some embodiments, the substrate 11 serves as a package structure for the illumination module 1 to protect the light-emitting layer 13 from liquid or moisture.

The control electrodes 12 are disposed on the substrate 11. The light-emitting layer 13 is overlaid on the control electrodes 12. In some embodiments, the light-enduing layer 13 is an OLED layer. The light-emitting layer 13 is configured to emit a light beam. The control electrodes 14 are disposed on the light-emitting layer 13.

The control electrodes 12 and 14 are made from transparent conductive materials, such as indium tin oxide (ITO), indium zinc oxide (IZO), or aluminum zinc oxide (AZO). The control electrodes 12 and 14 are electrically connected to the control module 40.

In the embodiment, the touch panel 20 includes a number of touch electrodes 21, a dielectric layer 22, a number of touch electrodes 23, and a substrate 24. In some embodiments, the substrate 11, the control electrodes 12, the light-emitting layer 13, the control electrodes 14, the touch electrodes 21, the dielectric layer 22, the touch electrodes 23, the substrate 24, and the connection layer 30 are parallel to each other.

The touch electrodes 21 are disposed over the control electrode 14. The dielectric layer 22 is overlaid on the touch electrodes 21, and between the touch electrodes 21 and 23. The dielectric layer 22 is configured to separate the touch electrodes 21 and 23. The touch electrodes 23 are disposed on the dielectric layer 22.

The touch electrodes 21 and 23 are made from transparent conductive. materials, such as indium tin oxide (ITO), indium zinc oxide (IZO), or aluminum zinc oxide (AZO). The touch electrodes 21 and 23 are electrically connected to the control module 40.

The substrate 24 is overlaid on the touch electrodes 23. In some embodiments, the substrate 24 is made from transparent materials, such as glass. In some embodiments, the substrate 24 or the entire touch panel 20 serves as a package structure for the illumination module 1 to protect the light-emitting layer 13 from liquid or moisture.

The liquid or moisture permeating to the light-emitting layer 13 greatly decreases the service life of the light-emitting panel 1. Therefore, the service life of the light-emitting panel is increased by the protection of the substrate 24 or the entire touch panel 20.

The connection layer 30 is located between the control electrode 14 and the touch electrode 21, and configured to combine with the control electrode 14 and the touch electrode 21. In some embodiments, the connection layer 30 is made from transparent insulation materials.

In some embodiments, the connection layer 30 is formed of a single piece, The control electrode 14 and the touch electrode 21 are respectively formed on two opposite sides of the connection layer 30 by a semiconductor manufacturing process, such as deposition process, etching process and/or photolithography process. Therefore, the thickness of the connection layer 30 is thin. The thickness of the illumination module 1 is decreased.

In some embodiments, the light-emitting panel 10 and the touch panel 20 are transparent. The outer surfaces S1 and S2 of the illumination module 1 are light-emitting surfaces, and the light beam emitted by the light-emitting layer 13 passes though the outer surfaces S1 and S2.

Figure 3B:
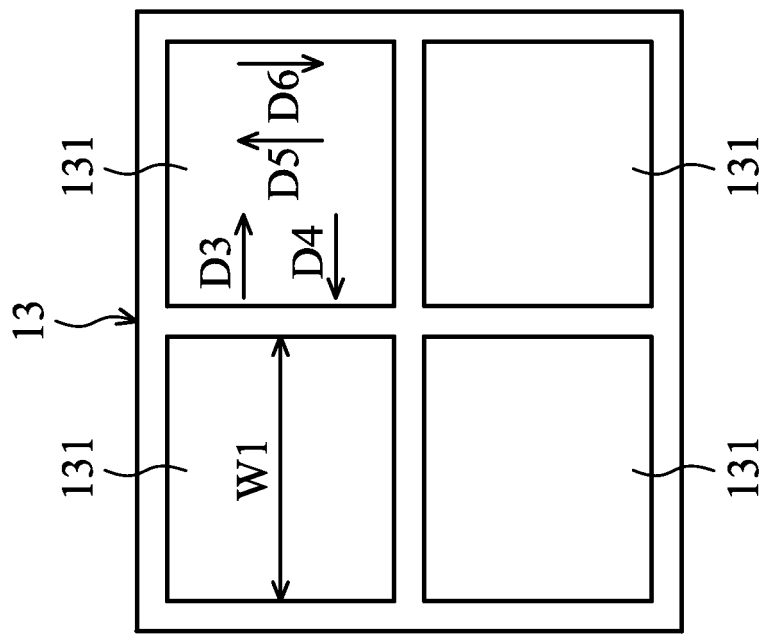
FIG. 3B is a top view of a light-emitting layer in accordance with some embodiments of the present disclosure.
Figure 3A:
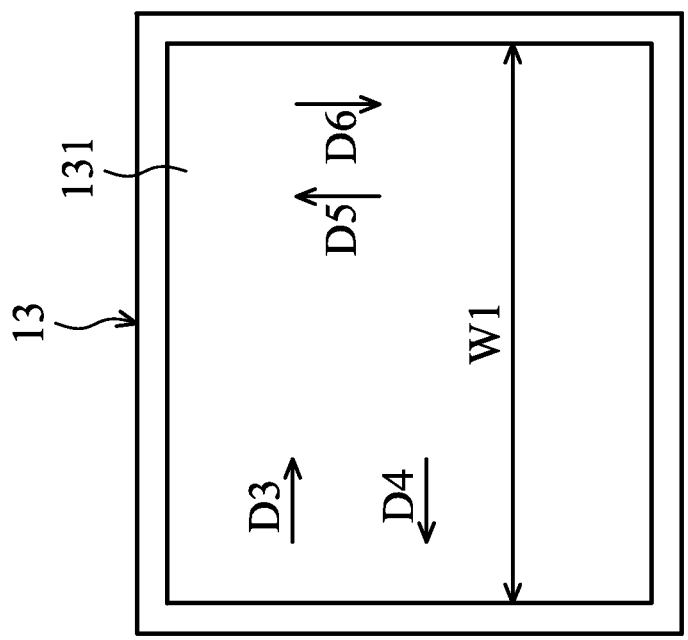
FIG. 3A is a top view of a light-emitting layer in accordance with some embodiments of the present disclosure.

FIG. 3A is a top view of the light-emitting layer 13 in accordance with some embodiments of the present disclosure. The light-emitting layer 13 further includes a light-emitting material 131. The light-emitting material 131 is a thin structure that is parallel to the light-emitting layer 13. The light-emitting material 131 is configured to emit a light beam. The light-emitting material 131 is formed of a single piece.

In some embodiments, the area of the light-emitting layer 13 is substantially equal to or greater than the area of the light-emitting material 131.

FIG. 3B is a top view of a light-emitting layer 13 in accordance with some embodiments of the present disclosure. The light-emitting layer 13 further includes a number of light-emitting materials 131. For example, as shown in FIG. 3B, there are four light-emitting materials 131 in the light-emitting layer 13. The light-emitting materials 131 are arranged on the control electrodes 12 in an array. Each of the light-emitting materials 131 is formed of a single piece.

In some embodiments, each of the light-emitting materials 131 is greater than N cm^2, and the N is a positive integer in a range from 1 to 2500. in some embodiments, the area of the light-emitting layer 13 is sustainably smaller than M times of an area of the light-emitting material 131, and the M is a positive integer, and in a range from 2 to 10 times.

Since the number of the light-emitting materials 131 is few, the manufacturing process of the illumination module 1 is simplified, and the manufacturing cost of the illumination module 1 is decreased.

Figure 4A:
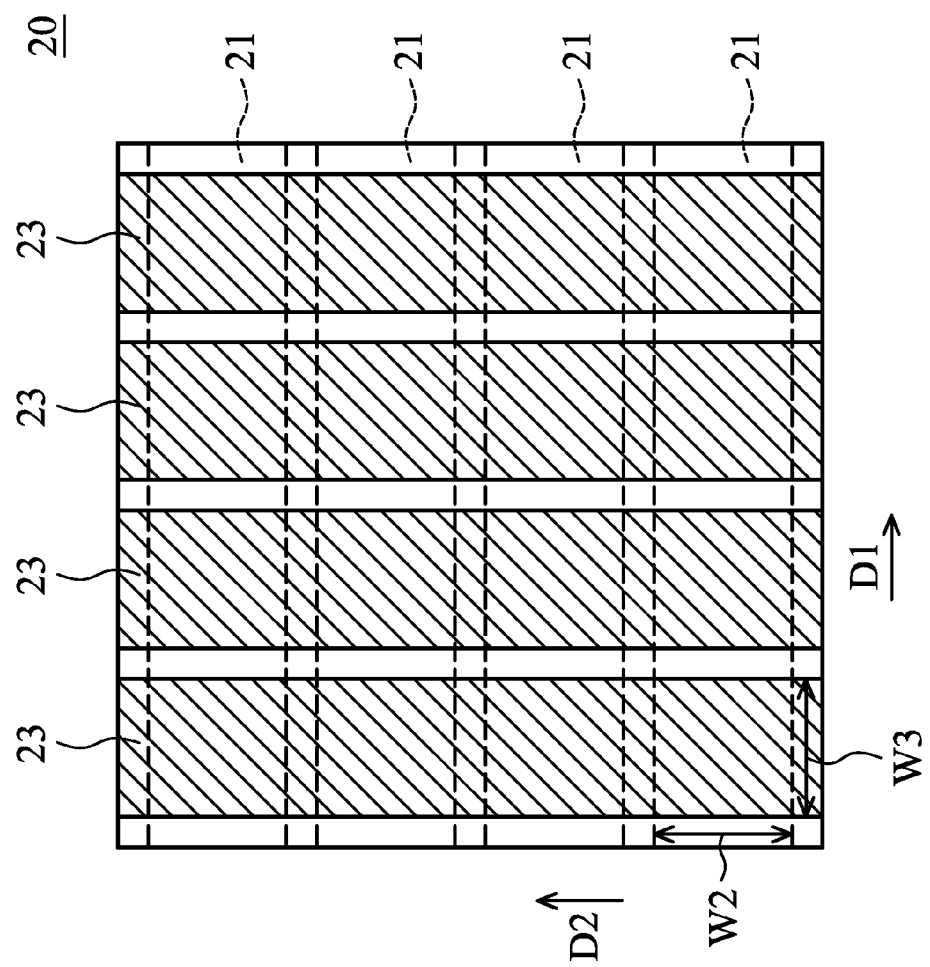
FIG. 4A is a top view of a touch panel in accordance with some embodiments of the present disclosure.

FIG. 4A is a top view of the touch panel 20 in accordance with some embodiments of the present disclosure. The touch electrodes 21 are arranged under the dielectric layer 22 in an array, and the touch electrodes 23 are arranged on the dielectric layer 22 in an array.

In some embodiments, the touch electrodes 21 are elongated structures. The touch electrodes 21 extend along a first direction D1, and are parallel to each other. The touch electrodes 21 are separated from each other, and each of the touch electrodes 21 is formed of a single piece.

The width W1 of each of the light-emitting materials 131 is greater than or substantially equal to the width W2 of each of the touch electrodes 21, in some embodiments, the width W1 of each of the light-emitting materials 131 is greater than half of the width W2 of each of the touch electrodes 21. In some embodiments, the area of each of the light-emitting materials 131 is greater than or substantially equal to the area of each of the touch electrodes 1. In some embodiments, the area of each of the light-emitting materials 131 is greater than half of the area of each of the touch electrodes 21.

In some embodiments, the touch electrodes 23 are elongated structures, The touch electrodes 23 are and extended along a second direction D2, which is perpendicular to the first direction D1, and parallel to each other. The touch electrodes 23 are separated from each other, and each of the touch electrodes 23 is formed of a single piece.

The width W1 of each of the light-emitting materials 11 is greater than or substantially equal to the width W3 of each of the touch electrodes 23. In some embodiments, the width W1 of each of the light-emitting materials 131 is greater than half of the width W3 of each of the touch electrodes 23. In some embodiments, the area of each of the light-emitting materials 131 is greater than or substantially equal to the area of each of the touch electrodes 23. In some embodiments, the area of each of the light-emitting materials 131 is greater than half of the area of each of the touch electrodes 23.

As shown in FIGS. 2, 3A, 3B and 4A, a touch event is triggered when a touch object A1, such as a finger, touches the outer surface S1 of the touch panel 20 or the outer surface S2 of the light-emitting panel 10. When a touch event is triggered, the control module 40 controls the luminance or the color temperature of the light beam, or controls the light-emitting layer 13 to be enabled or disabled according to the touch event.

In some embodiments, the touch event includes a switch event, a luminance-adjustment event, and/or a color-temperature adjustment event. The switch event is triggered by touching a point on the outer surface S1 or the outer surface S2 over the touch electrodes 21 and/or the touch electrodes 23. When a switch event is triggered, the control module 40 controls the light-emitting layer 13 to be enabled or disabled according to the switch event.

For example, a switch event is triggered then the light-emitting layer 13 is disabled. The light-emitting layer 13 is enabled by the control module 40 transmitting power to the light-emitting layer 13 via the control electrodes 12 and the control electrodes 14, and then the light-emitting layer 13 emits a light beam. For example, a switch event is triggered when the light-emitting layer 13 is enabled, The control module 40 stops transmitting power to the light-emitting layer 13 via the control electrodes 12 and the control electrodes 14, and then the light-emitting layer 13 is disabled.

As shown in FIG. 3B, in some embodiments, each of the light-emitting materials 131 can be individually enabled or disabled by a switch event triggered over the corresponding light-emitting material 131.

As shown in FIGS. 2, 3A, 3B and 4A, the luminance-adjustment event is triggered by sliding the touch object A1 on the outer surface S1 or the outer surface S2. When a luminance-adjustment event is triggered, the control module 40 controls the luminance of the light beam according to the luminance-adjustment event For example, when the touch object A1 slides on the outer surface S1 or the outer surface S2 in the sliding direction D3 over the touch electrodes 21 and/or the touch electrodes 23, the control module 40 gradually increases the current being transmitted to the light-emitting materials 131 via the control electrodes 12 and the control electrodes 14, and the luminance of the light beam is gradually increased. When the touch object A1. slides on the outer surface S1 or the outer surface S2 in the sliding direction D4, the control module 40 gradually decreases the current being transmitted to the light-emitting materials 131 via the control electrodes 12 and the control electrodes 14 over the touch electrodes 21 and/or the touch electrodes 23, and the luminance of the light beam is gradually decreased.

As shown in FIG. 3B, in some embodiments, each of the light-emitting materials 131 can be adjusted individually by a luminance-adjustment event triggered over the corresponding light-emitting material 131.

As shown in FIGS. 2, 3A, 3B and 4A, the color-temperature adjustment event is triggered by sliding the touch object A1 on the outer surface S1 or the outer surface S2. When a color-temperature adjustment event is triggered, the control module 40 controls a color temperature of the light beam according to the color-temperature adjustment event.

For example, when the touch object A1 slides on the outer surface S1 or the outer surface S2 in the sliding direction D5 over the touch electrodes 21 and/or the touch electrodes 23, the control module 40 gradually increases the voltage of the light-emitting materials 131 via the control electrodes 12 and the control electrodes 14, and the color temperature of the light beam is gradually increased. When the touch object A1 slides on the outer surface S1 or the outer surface S2 in the sliding direction D6 over the touch electrodes 21 and/or the touch electrodes 23, the control module 40 gradually decreases the voltage of the light-emitting material 131 via the control electrodes 12 and the control electrodes 14, and the color temperature of the light beam is gradually decreased.

As shown in FIG. 3B, in some embodiments, each of the light-emitting materials 131 can be individually adjusted by a color-temperature adjustment event triggered over the corresponding light-emitting material 131.

Figure 4B:
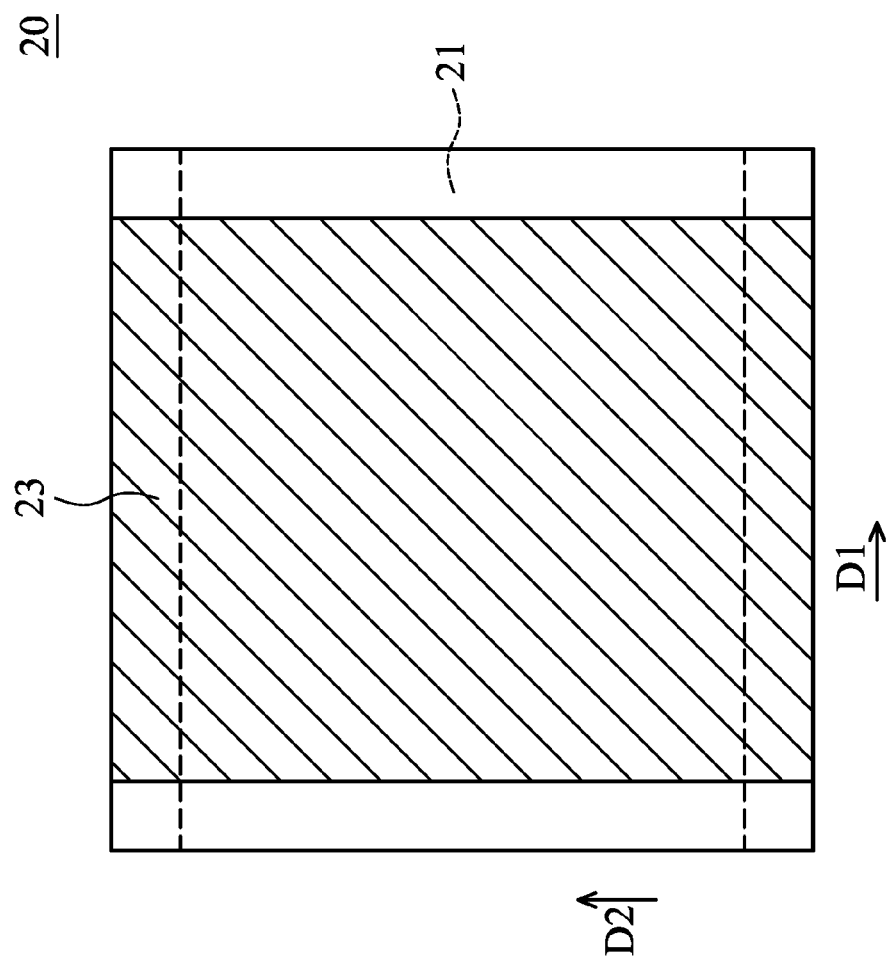
FIG. 4B is a top view of a touch panel in accordance with some embodiments of the present disclosure.

FIG. 4B is a top view of a touch panel 20 in accordance with so e embodiments of the present. disclosure. In some embodiments, the touch panel 20 includes one touch electrode 21 and one touch electrode 23. The light-emitting layer 13 includes one light-emitting material 131 (as shown in FIG. 3A), one control electrode 12, and one control electrode 14.

The width W1 of the light-emitting material 131 is substantially equal to or greater than the width of the touch electrode 21 and/or the touch electrode 23. The area of the light-emitting material 131 is substantially equal to or greater than area of the touch electrode 21 and/or the touch electrode 23.

Figure 5:
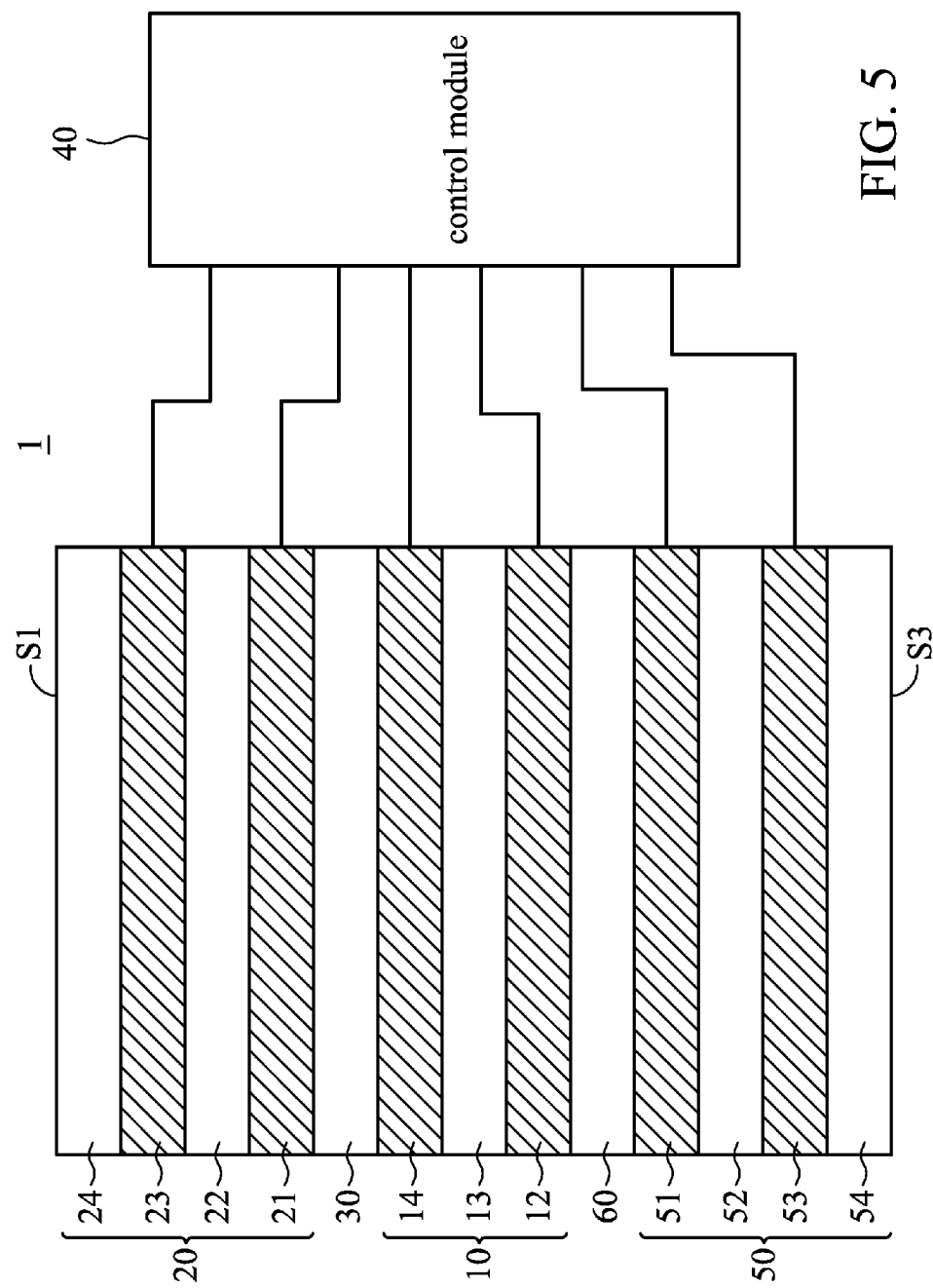
FIG. 5 is a schematic view of an illumination module in accordance with a second embodiment of the present disclosure.

FIG. 5 is a schematic view of an illumination module 1 in accordance with a second embodiment of the present disclosure. In the embodiments, the illumination module 1 further includes a touch panel 50 and a connection layer 60. The substrate 11 of the light-emitting panel 10 is excluded. The touch panel 50 is overlaid under the light-emitting panel 10. In other words, the touch panel 20 and the touch panel 50 are overlaid at two opposite sides of the light-emitting panel 10. Therefore, the touch function is provided at two opposite sides (outer surfaces S1 and S3) of the illumination module 1.

Furthermore, the touch panel 20 and the touch panel 50 are transparent. The outer surfaces S1 and S3 are light-emitting surfaces, and the light beam emitted by the light-emitting layer 13 passes though the outer surfaces S1 and S3.

The touch panel 50 further includes a number of touch electrodes 51, a dielectric layer 52, a number of touch electrodes 53, and a substrate 54. In some embodiments, the touch electrodes 51 are disposed under the control electrode 12. The dielectric layer 52 is overlaid under the touch electrodes 51, and between the touch electrodes 51 and 53. The touch electrodes 53 are disposed under the dielectric layer 52. The substrate 54 is overlaid under the touch electrodes 53.

The touch electrodes 51 and 53 are electrically connected to the control module 40. The connection layer 60 is located between the control electrodes 12 and the touch electrodes 51, and configured to combine with the control electrodes 12 and the touch electrodes 51.

In some embodiments, the touch panel 20 and the touch panel 50 serve as package structures for the Muir ion module 1 to protect the light-emitting layer 13 from liquid or moisture.

Figure 6:
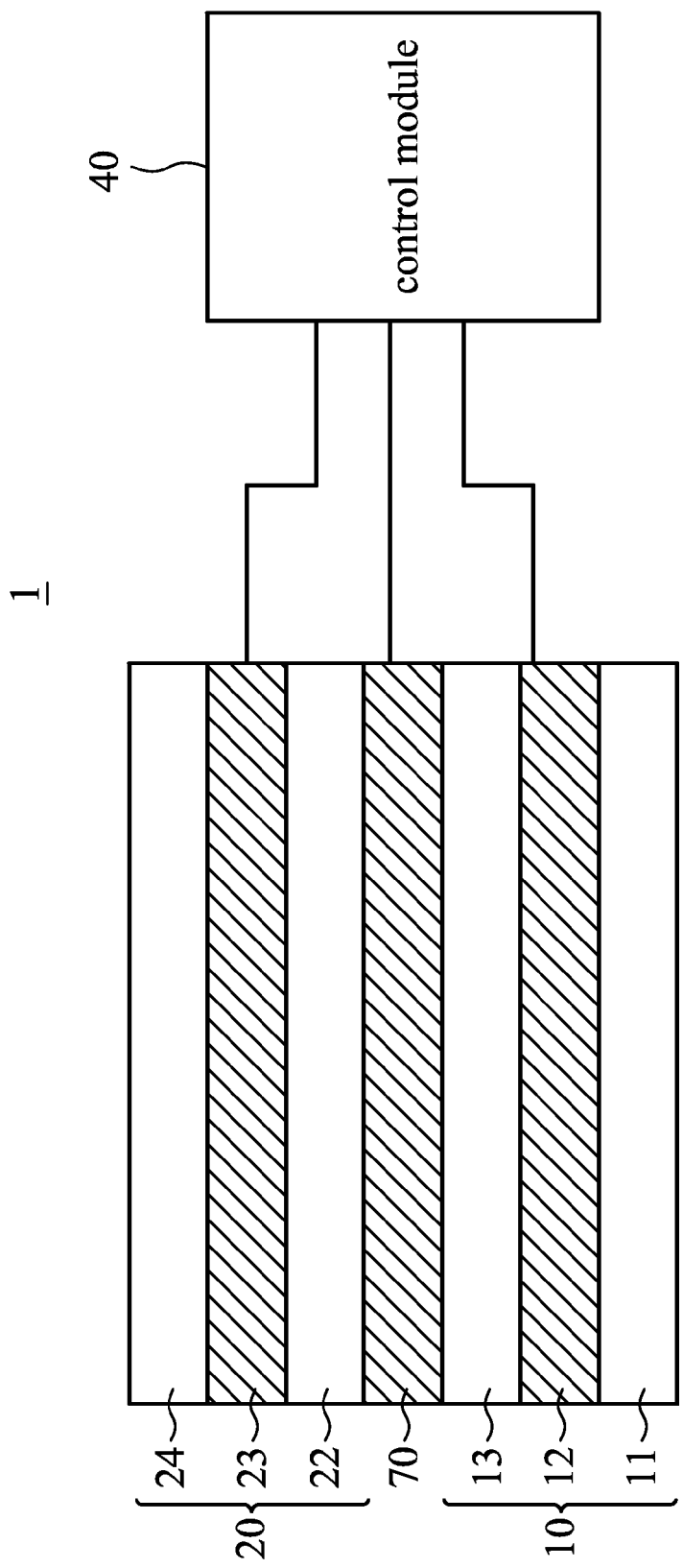
FIG. 6 is a schematic view of an illumination module in accordance with a third embodiment of the present disclosure.

FIG. 6 is a schematic view of an illumination module 1 in accordance with a third embodiment of the present disclosure. The main differences between the first embodiment and the second embodiment are described as follows. The touch electrodes 21, the control electrodes 14 and the connection layer 30 of the first embodiment are replaced by the common electrodes 70. In other words, the common electrodes 70 serve as the touch electrodes 21 and the control electrodes 14.

Since the connection layer 30 of the first embodiment is excluded and the touch electrodes 21 and the control electrodes 14 are integrated as the common electrodes 70, the thickness of the illumination module 1 is decreased further.

The common electrodes 70 are located between the light-emitting layer 13 and under the dielectric layer 22, and connected to the light-emitting layer 13 and the dielectric layer 22. The common electrodes 70 are electrically connected to the control module 40.

The touch electrodes 23 and the common electrodes 70 generate a touch signal according to a touch event, and the control module 40 controls the light-emitting layer 13 via the control electrodes 12 and the common electrodes 70 according to the touch signal.

In some embodiments, the common electrodes 70 are applied to the second embodiment. The common electrodes 70 are located between the light-emitting panel 10 and the touch panel 20, and between the light-emitting panel 10 and the touch panel 50.

Figure 7:
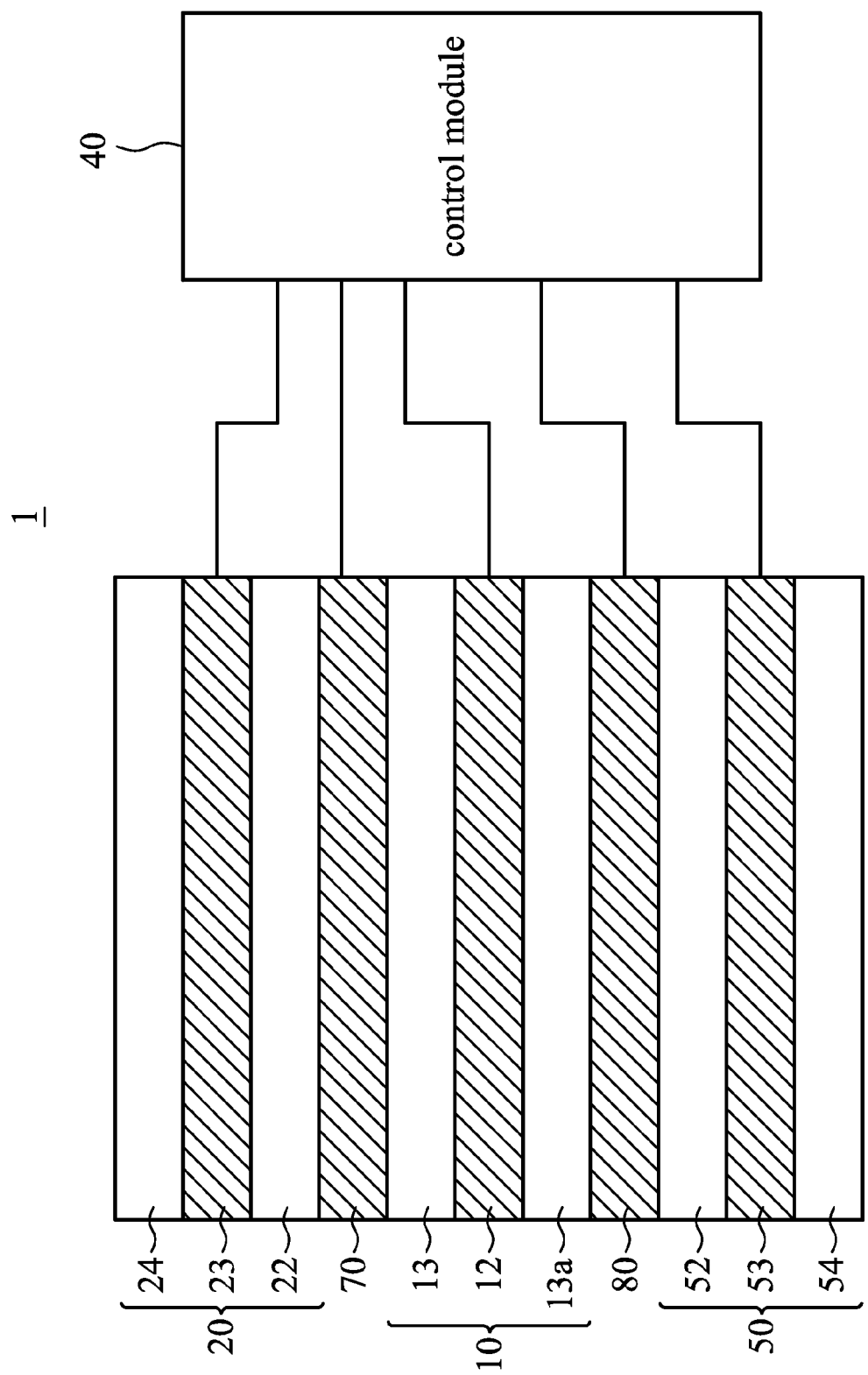
FIG. 7 is a schematic view of an illumination module in accordance with a fourth embodiment of the present disclosure.

FIG. 7 is a schematic view of an illumination module 1 in accordance with a fourth embodiment, of the present disclosure. The main differences between fourth embodiment and the third embodiment are described as follows. The substrate 11 of the third embodiment is replaced by a light-emitting layer 13a, The second light-emitting layer 13a is disposed under the control electrode 12.

The illumination module 1 further includes a number of common electrodes 80 disposed under the light-emitting layer 13a and a touch panel 50 disposed under the common electrodes 80. In some embodiments, the touch panel 20 and the touch panel 50 serve as package structures for the illumination module 1 to protect the light-emitting layer 13 from liquid or moisture.

The touch panel 50 includes a dielectric layer 52, a number of touch electrodes 53, and a substrate 54. In sole embodiments, the dielectric layer 52 is overlaid under the common electrodes 80. The touch electrodes 53 are disposed under the dielectric layer 52. The substrate 54 is overlaid under the touch electrodes 53.

The touch electrodes 53 and the common electrodes 80 are electrically connected to the control module 40. The touch electrodes 53 and the common electrodes 80 generate a touch signal according to a touch event. The control module 40 controls the light-emitting layer 13a via the control electrodes 12 and the common electrodes 80 according to the touch signal. The control module 40 controls a luminance or a color temperature of the light beam or controls the light-emitting layer 13a to be enabled or disabled according to the touch event.

In the embodiments, the colors of the light beams emitted by the emitting layer 13 and 13a may be different or the same. The light-emitting layer 13 or 13a may be enabled or disabled individually. Therefore, the light beams emitted by the illumination device 1 are more colorful and adjustable.

In conclusion, the illumination device includes a touch panel overlaid on a light-emitting panel. The touch panel provides touch functionality to control the light-emitting panel, and the touch panel also serves as a package structure for the light-emitting panel to increase the service life of the light-emitting It will be apparent to those skilled in the art that various modifications and variations can be made to the disclosed embodiments. It is intended that the specification and examples be considered as exemplary only with a true scope of the disclosure being indicated by the follow a claims and their equivalents.

What is claimed is:

1. An illumination device, comprising:
   a light-emitting panel comprising:
      a first control electrode;
      a light-emitting layer configured to emit a light beam and overlaid on the first control electrode; and
      a second control electrode disposed on the light-emitting layer,
   a touch panel, overlaid on the second control electrode of the light-emitting panel, comprising:
      a first touch electrode;
      a second touch electrode disposed on the second control electrode; and
      a dielectric layer between the first touch electrode and the second touch electrode; and
   a control module electrically connected to the first and second control electrodes of the light-emitting panel and the first and second touch electrodes of the touch panel;
   wherein the touch panel generates a touch signal according to a touch event, and the control module controls the light-emitting layer according to the touch signal,
   wherein the light-emitting layer further comprises a light-emitting material, and a width of the light-emitting material is greater than half of a width of the first touch electrode.

2. The illumination device as claimed in claim 1, wherein the light-emitting panel is an OLED panel.

3. The illumination device as claimed in claim 1, further comprising a connection layer located between the second control electrode and the second touch electrode, and configured to combine with the second control electrode and the second touch electrode.

4. The illumination device as claimed in claim 1, further comprising a connection layer located between the light-emitting panel and the touch panel and configured to combine with the light-emitting panel and the touch panel.

5. The illumination device as claimed in claim 1, wherein the touch event comprises a switch event, a luminance-adjustment event, or a color-temperature adjustment event, wherein the control module controls the light-emitting layer to be enabled or disabled according to the switch event, controls a luminance of the light beam according to the luminance-adjustment event, or controls a color temperature of the light beam according to the color-temperature adjustment event.

6. The illumination device as claimed in claim 5, wherein the switch event is triggered by touching a point on the touch panel or the light-emitting panel.

7. The illumination device as claimed in claim 5, wherein the touch panel further comprises a plurality of second touch electrodes, and the first and second touch electrodes are arranged in an array, wherein the luminance-adjustment event is triggered by sliding a touch object on the touch panel or the light-emitting panel and over the second touch electrodes.

8. The illumination device as claimed in claim 5, wherein the touch panel further comprises a plurality of second touch electrodes, and the first and second touch electrodes are arranged in an array, wherein the color-temperature adjustment event is triggered by sliding a touch object on the touch panel or the light-emitting panel and over the second touch electrodes.

9. An illumination device, comprising:
a light-emitting panel comprising:
a first light-emitting layer configured to emit a light beam; and
a control electrode disposed under the first light-emitting layer;
a first common electrode disposed on the first light-emitting layer;
a first touch panel, comprising:
a first dielectric layer overlaid on the first common electrode; and
a first touch electrode disposed on the first dielectric layer; and
a control module electrically connected to the control electrode, the first common electrode, and the first touch electrode;
wherein the first touch electrode and the first common electrode generate a first touch signal according to a first touch event, and the control module controls the first light-emitting layer via the control electrode and the first common electrode according to the first touch signal,
wherein the first light-emitting layer further comprises a light-emitting material, and a width of the light-emitting material is greater than half of a width of the first touch electrode.

10. The illumination device as claimed in claim 9, wherein the first light-emitting layer is an OLED layer.

11. The illumination device as claimed in claim 9, wherein the control module controls a luminance or a color temperature of the light beam, or controls the first light-emitting layer to be enabled or disabled according to the first touch event.

12. The illumination device as claimed in claim 9, further comprising:
a second light-emitting layer disposed under the control electrode;
a second common electrode disposed under the second light-emitting layer; and
a second touch panel, comprising:
a second dielectric layer overlaid under the second common electrode; and
a second touch electrode disposed under the second dielectric layer;
wherein the control module is electrically connected to the second common electrode and the second touch electrode,
wherein the second touch electrode and the second common electrode generate a second touch signal according to a second touch event, and the control module controls the second light-emitting layer via the control electrode and the second common electrode according to the second touch signal.

13. The illumination device as claimed in claim 12, wherein the control module controls a luminance or a color temperature of the light beam, or controls the second light-emitting layer to be enabled or disabled according to the second touch event.

14. An illumination device, comprising:
a first touch panel, comprising a first touch electrode;
a light-emitting panel, overlaid on the first touch panel, comprising:
a first control electrode;
a light-emitting layer configured to emit a light beam and overlaid on the first control electrode; and
a second control electrode disposed on the light-emitting layer,
a second touch panel, overlaid on the second control electrode of the light-emitting panel, comprising:
a second touch electrode;
a third touch electrode disposed on the second control electrode; and
a dielectric layer between the second touch electrode and the third touch electrode; and
a control module electrically connected to the first and second control electrodes of the light-emitting panel, the first touch panel, and the second and third touch electrodes of the second touch panel;
wherein the first touch panel or the second touch panel generates a touch signal according to a touch event, and the control module controls the light-emitting layer according to the touch signal,
wherein the light-emitting layer further comprises a light-emitting material, and a width of the light-emitting material is greater than half of a width of the first touch electrode or a width of the second touch electrode.

15. The illumination device as claimed in claim 14, wherein the first touch panel and the second touch panel are transparent, and the light beam emitted by the light-emitting panel passes through the first touch panel and the second touch panel.

16. The illumination device as claimed in claim 14, wherein the light-emitting panel is an OLED panel.

17. The illumination device as claimed in claim 14, wherein the first touch panel is overlaid under the first control electrode, and the first control electrode is electrically connected to the control module.

18. The illumination device as claimed in claim 14, wherein the control module controls a luminance or a color temperature of the light beam, or controls the light-emitting layer to be enabled or disabled according to the touch event.

* * * * *